United States Patent
Ozawa et al.

(10) Patent No.: US 6,808,818 B2
(45) Date of Patent: Oct. 26, 2004

(54) FUSIBLE POLYIMIDE AND COMPOSITE POLYIMIDE FILM

(75) Inventors: Hideki Ozawa, Chiba (JP); Shigeru Yamamoto, Chiba (JP)

(73) Assignee: Ube Industries, Ltd., Yamaguchi (JP)

( * ) Notice: Subject to any disclaimer, the term of this patent is extended or adjusted under 35 U.S.C. 154(b) by 0 days.

(21) Appl. No.: 10/269,289

(22) Filed: Oct. 11, 2002

(65) Prior Publication Data

US 2003/0072954 A1 Apr. 17, 2003

(30) Foreign Application Priority Data

Oct. 11, 2001 (JP) ........................................ 2001-313446

(51) Int. Cl.[7] .......................... B32B 15/08; B32B 27/00; C08G 73/10
(52) U.S. Cl. ................................ 428/473.5; 428/411.1; 428/458; 428/216; 528/125; 528/128; 528/170; 528/172; 528/173; 528/183; 528/187; 528/220; 528/229; 528/350; 528/353
(58) Field of Search ................................ 528/125, 128, 528/170, 172–173, 183, 185, 187, 220, 229, 350, 353; 428/411.1, 473.5, 458, 214, 457

(56) References Cited

U.S. PATENT DOCUMENTS

| | | | | |
|---|---|---|---|---|
| 4,795,798 A | * | 1/1989 | Tamai et al. ................. | 528/185 |
| 4,923,968 A | * | 5/1990 | Kunimune et al. ......... | 528/353 |
| 5,171,828 A | * | 12/1992 | Meterko et al. ............. | 528/353 |
| 5,298,331 A | * | 3/1994 | Kanakarajan et al. ........ | 428/458 |
| 5,300,619 A | * | 4/1994 | Okada et al. ................ | 528/170 |
| 5,306,741 A | * | 4/1994 | Chen et al. .................. | 522/164 |
| 5,338,826 A | * | 8/1994 | St. Clair et al. ............. | 528/353 |
| 5,418,066 A | * | 5/1995 | Chen et al. .................. | 428/458 |
| 6,133,408 A | * | 10/2000 | Chiu et al. ................... | 528/353 |
| 6,143,399 A | * | 11/2000 | Kohno et al. ................ | 428/220 |
| 6,605,366 B2 | * | 8/2003 | Yamaguchi et al. ...... | 428/473.5 |

* cited by examiner

*Primary Examiner*—P. Hampton Hightower
(74) *Attorney, Agent, or Firm*—Reed Smith LLP

(57) ABSTRACT

A fusible polyimide showing a fusion endothermic peak in a differential scanning calorimeter has a recurring unit of the following formula (1):

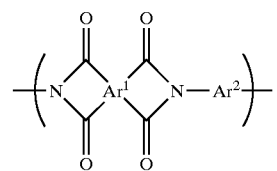

(1)

in which $Ar^1$ is a mixture of residues of tetracarboxylic dianhydrides composed of 12–25 mol. & of a residue of pyromellitic dianhydride, 5–15 mol. % of a residue of 3,3'4,4'-benzophenonetetracarboxylic dianhydride, and a remaining mol. % of a residue of 3,3',4,4'-biphenyltetracarboxylic dianhydride, and $Ar^2$ is an aromatic diamine residue composed of 1,3-bis(4-aminophenoxy) benzene.

22 Claims, No Drawings

FUSIBLE POLYIMIDE AND COMPOSITE POLYIMIDE FILM

FIELD OF THE INVENTION

The present invention relates to fusible polyimide, a fusible polyimide film, a composite polyimide film having a fusible surface, and a metal film/composite polyimide film laminate, and a metal film/composite polyimide film/metal film laminate.

BACKGROUND OF THE INVENTION

Aromatic polyimide films show good high temperature resistance, good chemical properties, high electrical insulating property, and high mechanical strength, and therefore are widely employed in a variety of technical fields. For instance, an aromatic polyimide film is favorably employed in the form of a continuous aromatic polyimide film/metal film laminate structure for manufacturing a flexible printed circuit board (FPC), a carrier tape for tape-automated-bonding (TAB), and a tape of lead-on-chip (LOC) structure.

The aromatic polyimide film/metal film laminate can be produced by bonding a polyimide film to a metal film using a conventional adhesive such as an epoxy resin. However, due to low heat-resistance of the conventional adhesive, the produced composite sheet cannot show satisfactory high heat-resistance.

For obviating the above-mentioned problem, a variety of bonding methods have been proposed. For instance, an aromatic polyimide film/metal film laminate sheet is manufactured by producing a copper metal film on an aromatic polyimide film by electro-plating. Otherwise, an aromatic polyamide solution (i.e., a solution of a precursor of an aromatic polyimide resin) is coated on a copper film, dried, and heated for producing an aromatic polyimide film on the copper film.

An aromatic polyimide film/metal film composite sheet also can be produced using a thermoplastic polyimide resin.

U.S. Pat. No. 4,543,295 describes that a metal film/aromatic polyimide film laminate in which the metal film is bonded to the polyimide film at a high bonding strength is prepared by combining, by heating under pressure, a metal film and a composite aromatic polyimide film composed of a highly heat resistant substrate film and a thermoplastic thin polyimide layer bonded to the substrate film at a high bonding strength.

Each of Japanese Patent Publication No. 7-102648 and Japanese Patent Provisional Publication No. 10-138,318 describes a composite polyimide film produced by a co-extrusion method.

SUMMARY OF THE INVENTION

It is an object of the invention to provide fusible aromatic polyimide which can be bonded to a metal film, particularly, a stainless steel film and a copper film, with a high strength and which can be easily etched by a chemical etching method (or wet etching method).

The invention resides in fusible polyimide showing a fusion endothermic peak in a differential scanning calorimeter (DCS), preferably at a temperature of 340–380° C., which has a recurring unit of the formula (1):

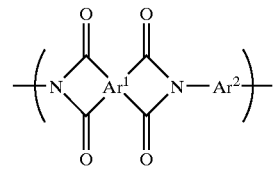

(1)

in which $Ar^1$ is a mixture of residues of tetracarboxylic dianhydrides comprising 12–25 mol. % of a residue of pyromellitic dianhydride, 5–15 mol. % of a residue of 3,3'4,4'-benzophenonetetracarboxylic dianhydride, and a remaining mol. % of a residue of 3,3',4,4'-biphenyltetracarboxylic dianhydride, and $Ar^2$ is an aromatic diamine residue comprising 1,3-bis (4-aminophenoxy) benzene.

The invention also resides in a fusible polyimide film showing a fusion endothermic peak in a differential scanning calorimeter, preferably at a temperature of 340–380° C., which comprises aromatic polyimide having a recurring unit of the aforementioned formula (1).

The invention further resides in a composite polyimide film comprising a polyimide substrate sheet and a fusible polyimide film united to the substrate sheet, in which the fusible polyimide film shows a fusion endothermic peak in a differential scanning calorimeter, preferably at a temperature of 340–380° C., and comprises aromatic polyimide having a recurring unit of the formula (1).

The invention further resides in a metal/composite polyimide film laminate comprising the above-mentioned composite polyimide film and a metal film combined to the composite polyimide film via the fusible polyimide film.

The invention furthermore resides in a metal/composite polyimide film/metal laminate comprising a first metal film having a thickness of 3 to 35 μm, a composite polyimide film having a thickness of 7 to 150 μm, and a second metal film having a thickness of 30 to 200 μm, in which the composite polyimide film comprises a polyimide substrate sheet and a fusible polyimide film united to the substrate sheet, in which the fusible polyimide film shows a fusion endothermic peak in a differential scanning calorimeter and comprises aromatic polyimide having a recurring unit of the aforementioned formula (1).

The invention furthermore resides in a metal film/composite polyimide film/metal film laminate in which each metal film independently is a copper film or a stainless steal film, comprising a first metal film having a thickness of 3 to 35 μm, a composite polyimide film having a thickness of 7 to 150 μm, and a second metal film having a thickness of 3 to 200 μm, in which the composite polyimide film comprises a polyimide substrate sheet and a fusible polyimide film united to each surface of the substrate sheet, in which the fusible polyimide film shows a fusion endothermic peak in a differential scanning calorimeter, the composite polyimide film shows a modulus in tension in the range of 400 to 1,000 kgf/mm² at 25° C. in machine direction and traverse direction, the composite polyimide film shows a chemical etchable rate of 2.0 μm/min. or more, and both of the metal films are bonded to the composite polyimide film at 90° peel strength of 0.8 kgf/cm or more.

The chemical etchable rate is determined by the following procedure:

A specimen (i.e., laminate of a metal film/polyimide film/metal film, thickness: 20 μm) is immersed in an etching solution (composition: 36 wt. % of potassium hydroxide, 37 wt. % of monoethanol amine, and 27 wt.

% of water) heated to 80° C. Thereafter, a period of time required for completely dissolving the polyimide film in the etching solution is measured.

DETAILED DESCRIPTION OF THE INVENTION

Preferred embodiments of the invention are described below:

(1) The composite polyimide film, in which the polyimide substrate sheet comprises a polyimide prepared from 3,3',4,4'-biphenyltetracarboxylic dianhydride (s-BPDA) and one aromatic diamine selected from the group consisting of p-phenylenediamine (PPD) and 4,4'-diaminodiphenyl ether (DADE) or a polyimide prepared from at least one aromatic carboxylic dianhydride selected from the group consisting of 3,3',4,4'-biphenyltetracarboxylic dianhydride (s-BPDA) and pyromellitic dianhydride (PMDA) and a mixture of p-phenylenediamine (PPD) and 4,4'-diaminodiphenyl ether (DADE). In the composition, the following composition is preferred: 20–100 mol. % of s-BPDA and 80–0 mol. % of PMDA in the carboxylic dianhydride composition, and 70–100 mol. % of PPD and 30–0 mol. % of DADE in the diamine composition. The polyimide substrate sheet preferably has a glass transition temperature (Tg) of not lower than 300° C., preferably not lower than 320° C. Otherwise, the polyimide substrate sheet can contain no observable glass transition temperature.

(2) The composite polyimide film which is prepared by the steps of co-extruding a solution of polyamide acid for the preparation of the polyimide substrate sheet and a solution of polyamide acid for the preparation of the polyimide having the recurring unit of the formula (1) to form a multi-layered polyamide acid solution, and heating the multi-layered polyamide acid solution until the multi-layered polyamide acid solution is dried and turns to the composite polyimide film.

(3) The composite polyimide film which is prepared by the steps of coating on the polyimide substrate sheet a solution of polyamide acid for the preparation of the polyimide having the recurring unit of the formula (1), and heating the coated polyamide acid solution until the coated acid solution is dried and turns to the polyimide film.

(4) The metal/composite polyimide film laminate which is prepared by pressing the metal film onto the composite polyimide film under heating.

(5) The metal/composite polyimide film laminate, in which the metal film has a thickness of 3 to 35 μm.

(6) The metal/composite polyimide film/metal laminate, in which the composite polyimide film shows a modulus in tension in the range of 400 to 1,000 kgf/mm² in each of machine direction and traverse direction.

(7) The metal/composite polyimide film/metal laminate, in which each of the metal film is fixed to the composite polyimide film at a 90° peel strength of 0.8 kgf/cm or higher at 25° C.

(8) The metal/composite polyimide film/metal laminate, in which the first metal film is a stainless steel film and the second metal film is a copper film or a stainless steel film.

The fusible polyimide of the invention has a recurring unit of the formula (1):

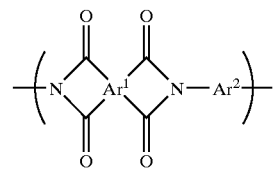

(1)

In the formula (1), $Ar^1$ means a mixture of residues of tetracarboxylic dianhydrides comprising 12–25 mol. % of a residue of pyromellitic dianhydride, 5–15 mol. % of a residue of 3,3',41'-benzophenonetetracarboxylic dianhydride, and a remaining mol. %, preferably 60–80 mol. %, of a residue of 3,3',4,4'-biphenyltetracarboxylic dianhydride, and $Ar^2$ is an aromatic diamine residue comprising 1,3-bis(4-aminophenoxy)benzene, preferably not less than 50 mol. %, more preferably not less than 70 mol. %.

The 1,3-bis(4-aminophenoxy)benzene can be employed optionally in combination with other diamine(s). Examples of the optionally employable diamine compounds include 4,4'-diaminobenzophenone, 4,4'-diaminodiphenylmethane, 2,2-bis(4-aminophenyl)propane, 1,4-bis(4-aminophenoxy) benzene, 4,4'-bis(4-aminophenyl)diphenyl ether, 4,4'-bis(4-aminophenyl)diphenylmethane, 4,4'-bis(4-amino-phenoxy) diphenyl ether, 4,4'-bis(4-aminophenoxy)diphenylmethane, 2,2-bis[4-(aminophenoxy)phenyl]propane, and 2,2-bis [4-(4-aminophenoxy)phenyl]hexafluoropropane; aliphatic amines, such as 1,4-diaminobutane, 1,6-diaminohexane, 1,8-diaminooctane, 1,4-diaminodecane, and 1,12-diaminododecane; and diaminosiloxanes, such as bis(3-aminopropyl)tetramethyldisiloxane. The optionally employable diamine compound can be employed in an amount of 50 molar % or less, particularly 30 mol. % or less, per the total amount of the diamine compounds.

The composite polyimide film of the invention can be prepared by the process set forth below.

First, a dope solution for the preparation of the fusible polyimide layer (or film) is prepared.

For preparing the dope solution, the reactive compounds, i.e., three (or more, if desired) tetracarboxylic dianhydride(s) and one or more diamine compound(s), are caused to react in an organic solvent at a temperature of approximately 100° C. or lower, preferably at a temperature of 20 to 60° C., so as to produce a polyamide acid (or polyamic acid), namely, a polyimide precursor. The polyamide acid solution or its diluted solution is employed as the dope solution.

In the preparation of the dope solution or in the process of polymerization of the polyamide acid, a gelation-inhibiting agent such as a phosphorus-containing stabilizer (e.g., triphenyl phosphate, or triphenyl phosphate) may be employed, in an amount of 0.01 to 1%, based on the amount of the polyamide acid. Also, an imidizing agent such as a basic organic catalyst (e.g., imidazole, 2-imidazole, 1,2-dimethylimidazole, or 2-phenylimidazole) may be added to the dope solution (i.e., polyamide acid solution) in an amount of 0.05 to 10 wt. %, particularly 0.1 to 2 wt. %, based on the amount of the polyamide acid. The imidizing agent is effective to well imidize the polyamide acid at a relatively low temperature.

In addition, a metal compound such as an organic aluminum compound (e.g., aluminum triacetylacetonate), an inorganic aluminum compound (e.g., aluminum hydroxide), or an organic tin compound may he incorporated into the dope solution in an amount of 1 ppm or more (in terms of the amount of metal), particularly 1 to 1,000 ppm, based on the amount of the polyamide acid, so that the thermoplastic polyimide layer can be bonded to a metal film at a higher bonding strength.

The preparation of the polyamide acid can be performed in an organic solvent such as N-methyl-2-pyrollidone, N,N-dimethylformamide, N,N-dimethylacetamide, N,N-diethylacetamide, dimethylsulfoxide, hexamethylphosphoramide, N-methylcaprolactam, or cresol or its derivative. The organic solvents can he employed singly or in combination.

The dope solution for the preparation of the polyimide substrate sheet can be prepared similarly in the known manner.

The composite polyimide sheet of the invention can be manufactured by co-extruding each dope solution continuously from a die having multiple slits to place a wet dope film composed of plural dope solutions on a metallic belt support. Each dope solution preferably contains the polyamide acid in an amount of 1 to 20 wt. %. The dope solution film is heated to a temperature of 120 to 400° C., so as to evaporate the solvent and further produce the desired composite polyimide film by way of cyclization reaction.

Otherwise, the composite polyimide film of the invention can be manufactured by first preparing a dope solution film for the substrate sheet or fusible polyimide film and placing on one dope solution film a different dope solution, that is, for the fusible polyimide film or substrate film. Thus produced composite dope solution film is heated to a temperature of 50 to 400° C., so as to evaporate the solvent and further produce the desired composite polyimide film by way of cyclization reaction.

Alternatively, the composite polyimide film can be prepared by the steps of coating on the polyimide substrate sheet a solution of a polyamide acid for the preparation of the fusible polyimide having the recurring unit of the formula (1), and heating the coated polyamide acid solution until the coated acid solution is dried and turns to the polyimide film.

The composite polyimide film of the invention preferably has a linear expansion coefficient (MD and TD, 50–200° C.) of $30 \times 10^{-6}$ cm/cm/° C. or less, preferably $15 \times 10^{-6}$ to $30 \times 10^{-6}$ cm/cm/° C. and a modulus tensile elasticity or modulus in tension (MD and TD, ASTM-D882) of 400 kg/mm$^2$ or more.

In the composite polyimide film, the polyimide substrate sheet preferably has a thickness of 5 to 125 μm, the fusible polyimide film which is preferably thinner than the substrate sheet and preferably has a thickness of 1 to 25 μm, more preferably 1 to 15 μm, most preferably 2 to 12 μm. The total thickness of the composite polyimide film generally is in the range of 7 to 150 μm, preferably 7 to 50 μm, more preferably 7 to 25 μm.

The composite polyimide film of the invention can be bonded to a metal film via the fusible polyimide film.

In the bonding procedure, a metal film is placed on the thin polyimide layer of the composite polyimide film.

Examples of the metal films include copper film, aluminum film, iron film, stainless steel film, gold film, palladium film, or a film of metal alloy. Preferred are an electrolytic copper film, a rolled copper film, a stainless steel film. The copper film preferably has a thickness of 3 to 35 μm, preferably 3 to 18 μm. The stainless steel film preferably has a thickness of 20 to 200 μm, preferably 3 to 18 μm. The metal film preferably has a surface roughness (Rz) of 3 μm or less, more preferably 0.5 to 3 μm, most preferably 1.5 to 3 μm or less. A metal film having such surface roughness is available under the name of VLP or LP (or HTE) for a copper film.

The fusible polyimide layer of the composite polyimide film is preferably subjected to surface treatment such as plasma discharge treatment or corona discharge treatment.

The metal film/composite polyimide film laminate of the invention is preferably produced by the steps of:
  placing a metal film on the thin polyimide layer of the composite polyimide film, and
  pressing under heating the combination of the metal film and the composite polyimide film.

The double belt press is preferably employed for the procedure of pressing under heating. A representative double belt press is described in U.S. Pat. No. 4,599,128, and is commercially available from Held Corporation (Germany). The double belt press is advantageously employed for the production of a metal/polyimide/metal laminate having a 90° peel strength of not lower than 0.8 kgf/cm, specifically not lower than 1 kgf/cm.

Other continuous laminating apparatuses such as a compressing apparatus or roll laminator can be also employed.

It is preferred to pre-heat the composite polyimide film or both of the composite polyimide film and the metal film(s) to 150–250° C., for 2–120 seconds in advance of the pressing procedure according to an in-line system.

The metal film/composite polyimide film laminate of the invention preferably is a continuous laminate having a width of approx. 400 mm or more, more preferably 500 mm or more.

The metal film/composite polyimide film/metal film laminate of the invention can be subjected to the known etching procedure.

In more detail, a positive type photo-resist is coated on the metal film of the laminate, exposed to ultra-violet rays, and developed in an alkaline solution, to produce a resist pattern comprising plural openings (having a diameter of 30 to 150 μm) at spaces of 100 to 200 μm. Subsequently, the metal film is etched using an aqueous ferric chloride solution and then the polyimide film is etched through the etched opening formed on the metal film using an etching solution comprising 20–50 wt. % of ethanol amine or iso(or di)propanolamine, 25–40 wt. % of potassium hydroxide (KOH) and 25–40 wt. % of water. The last etching procedure can be carried out at 50–80° C. for 5–20 min., in the case that the polyimide film is 50 μm thick.

The invention is further described by the following examples.

In the following examples, the physical and chemical characteristics were determined by the methods described below:

(1) Chemical Etching Rate

A specimen (i.e., laminate of a polyimide film and a stainless film, thickness: approx. 20 μm) is immersed in a commercially available etching solution (TPE3000, available from Toray Engineering Co., Ltd., Composition: 36 wt. % of potassium hydroxide, 37 wt. % of monoethanol amine, and 27 wt. % of water) heated to 80° C. Thereafter, a period of time required for completely dissolving the polyimide film in the etching solution is determined.

Etching rate(μm/min)=thickness of polyimide film (μm)/period of time required for complete dissolution (min)

(2) Peel Strength of Metal/Polyimide/Metal Laminate

90° peel strength is measured at room temperature at a rate of 50 mm/min.

(3) Fusion Endothermic Peak determined using a commercially available differential scanning calorimeter (DSC) by gradually heating from room temperature to 500° C. at a temperature elevation rate of 20° C/min.

EXAMPLE 1

In a reaction vessel equipped with a stirrer and a nitrogen gas inlet, 1,3-bis(4-aminophenoxy)benzene (TPE-R) was dissolved in N,N-dimethylacetamide (DMAc). To the mixture were added 3,3',4,4'-biphenyltetracarboxylic dianhydride (s-BPDA), pyromellitic dianhydride (PMDA) and 3,3',4,4'-benzophenonetetracarboxylic dianhydride (BTDA) at a molar ratio of 70:20:10 (s-BPDA:PMDA:BTDA), in an amount to give a DMAc solution containing the mixture at 18 wt. %]. The resulting mixture was kept at room temperature for 3 hrs. under stirring, to give a viscous dope solution.

The dope solution was spread on a glass plate having a spacer of 230 μm thick, dried at 100° C., and then heated slowly from 180 to 360° C., to evaporate the solvent and perform imidization. Thus, a polyimide film of 19 μm thick was produced.

The polyimide film showed a fusion endothermic peak in DSC at 350° C.

The polyimide film was placed between a rolled copper film (thickness 18 μm, available from Japan Energy Co., Ltd.) and a stainless steel film (thickness 20 μm, available from Japan Steel Co., Ltd.). The laminated body was heated for 5 min. using a hot press heated at 340° C., and pressed for one minute, at a pressure of 60 kgf/cm$^2$, to produce a metal film/polyimide film/metal film laminate.

The laminate showed an etching rate of 2.24 μm/min., a copper film peel strength of not less than 1 kgf/cm and a stainless steel film peel strength of not less than 1 kgf/cm.

EXAMPLE 2

The procedures of Example 1 for the production of a polyimide film were repeated except for changing the molar ratio of s-BPDA:PMDA:BTDA to 75:15:10.

The produced polyimide film showed a fusion endothermic peak in DSC at 350° C.

Then, the procedures of Example 1 for the production of a laminate was repeated using the above-produced polyimide film.

The laminate showed an etching rate of 1.71 μm/min., a copper film peel strength of not less than 1 kgf/cm and a stainless steel film peel strength of not less than 1 kgf/cm.

COMPARISON EXAMPLE 1

The procedures of Example 1 for the production of a polyimide film were repeated except for changing the molar ratio of s-BPDA:PMDA:BTDA to 60:30:10.

The produced polyimide film showed a fusion endothermic peak in DSC at 380° C.

Then, the procedures of Example 1 for the production of a laminate was repeated using the above-produced polyimide film.

The laminate showed an etching rate of 1.71 μm/min., a copper film peel strength of 0.3 kgf/cm and a stainless steel film peel strength of 0.0 kgf/cm.

COMPARISON EXAMPLE 2

The procedures of Example 1 for the production of a polyimide film were repeated except for changing the molar ratio of s-BPDA:PMDA:BTDA to 80:10:10.

The produced polyimide film showed no fusion endothermic peak in DSC.

Then, the procedures of Example 1 for the production of a laminate was repeated using the above-produced polyimide film.

The laminate showed an etching rate of 1.27 μm/min., a copper film peel strength of 0.8 kgf/cm and a stainless steel film peel strength of not less than 1.0 kgf/cm.

COMPARISON EXAMPLE 3

The procedures of Example 1 for the production of a polyimide film were repeated except for changing the molar ratio of s-BPDA:PMDA;BTDA to 70:30:0.

The produced polyimide film showed no fusion endothermic peak in DSC.

Then, the procedures of Example 1 for the production of a laminate was repeated using the above-produced polyimide film.

The laminate showed an etching rate of 2.00 μm/min., a copper film peel strength of 0.7 kgf/cm and a stainless steel film peel strength of 0.0 kgf/cm.

COMPARISON EXAMPLE 4

The procedures of Example 1 for the production of a polyimide film were repeated except for employing 3,1',4,4'-biphenylether tetracarboxylic dianhydride (ODPA) in place of the s-BPDA.PMDA:BTDA composition.

The produced polyimide film showed no fusion endothermic peak in DSC.

Then, the procedures of Example 1 for the production of a laminate was repeated using the above-produced polyimide film.

The laminate showed an etching rate of 0.49 μm/min., a copper film peel strength of not less than 1.0 kgf/cm and a stainless steel film peel strength of 0.5 kgf/cm.

EXAMPLE 3

In a reaction vessel equipped with a stirrer and a nitrogen gas inlet were successively placed N,N-dimethylacetamide (DMAc) add a mixture of p-phenylenediamine (PPD) and 3,3',4,4'-biphenyltetracarboxylic dianhydride (s-BPDA) [100:99.8, molar ratio, in an amount to give a DMAc solution containing the mixture at 18 wt. %]. The resulting mixture was kept at 50° C. for 3 hrs. under stirring, to give a viscous brown dope having a solution viscosity of approx. 1,500 poise (at 25° C.).

One dope solution (X) obtained above and two dope solutions (Y) obtained in Example 1 were simultaneously extruded onto a continuous metal belt from a manifold die having three slits, to give a Y/X/Y solution film structure, and the resulting dope solution films were continuously dried by air (heated to 140° C.), until the solution films were solidified and united. The united films were separated from the metal belt and heated in a heating furnace at gradually increased temperatures of 200° C. to 400° C. In the course of heating, the solvent was evaporated and imidization was performed. Thus produced continuous three layered composite polyimide film had total thickness of 16 μm, in which the thickness of substrate film (produced from X dope solution) was 12 μm and the thickness of each thin polyimide film (produced from Y dope solution) was 2 μm.

The composite polyimide film had a modulus in tensions of 770 to 800 kgf/mm$^2$ in both of machine direction (MD) and traverse direction (ED) at 25° C.

Then, the procedures of Example 1 for the production of a laminate was repeated using the above-produced composite polyimide film.

The laminate showed an etching rate of 2.83 μm/min., a copper film peel strength of not less than 2.0 kgf/cm and a stainless steel film peel strength of 1.1 kgf/cm.

EXAMPLE 4

The procedures for the production of a composite polyimide film in Example 3 were repeated except for using the dope solution of Example 2, to give a continuous three layered composite polyimide film having a total thickness of 16 μm, in which the thickness of substrate film was 12 μm and the thickness of each thin polyimide film was 2 μm.

The composite polyimide film had a modulus in tensions of 770 to 800 kgf/mm² in both of machine direction (MD) and traverse direction (TD) at 25° C.

Then, the procedures of Example 1 for the production of a laminate was repeated using the above-produced composite polyimide film.

The laminate showed an etching rate of 2.21 μm/min, a copper film peel strength of not less than 2.0 kgf/am and a stainless steel film peel strength of 1.1 kgf/cm.

What is claimed is:

1. Fusible polyimide showing a fusion endothermic peak in a differential scanning calorimeter which has a recurring unit of the following formula (1):

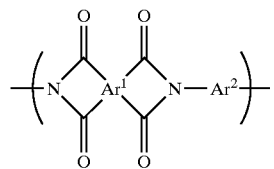

(1)

in which $Ar^1$ is a mixture of residues of tetracarboxylic dianhydrides comprising 12–25 mol.% of a residue of pyromellitic dianhydride, 5–15 mol. % of a residue of 3,3'4,4'-benzophenonetetracarboxylic dianhydride, and a remaining mol. % of a residue of 3,3',4,4'-biphenyltetracarboxylic dianhydride, and $Ar^2$ is an aromatic diamine residue comprising 1,3-bis(4-aminophenoxy) benzene.

2. The fusible polyimide of claim 1, which shows a fusion endothermic peak at a temperature in the range of 340–380° C. in a differential scanning calorimeter.

3. A fusible polyimide film showing a fusion endothermic peak in a differential scanning calorimeter which comprises aromatic polyimide having a recurring unit of the following formula (1);

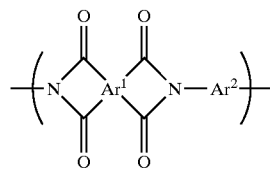

(1)

in which $Ar^1$ is a mixture of residues of tetracarboxylic dianhydrides comprising 12–25 mol.% of a residue of pyromellitic dianhydride, 5–15 mol. % of a residue of 3,3'4,4'-benzophenonetetracarboxylic dianhydride, and a remaining mol. % of a residue of 3,3',4,4'-biphenyltetracarboxylic dianhydride, and $Ar^2$ is an aromatic diamine residue comprising 1,3-bis(4-aminophenoxy) benzene.

4. The fusible polyimide film of claim 3, which shows a fusion endothermic peak at a temperature in the range of 340–380° C. in a differential scanning calorimeter.

5. A composite polyimide film comprising a polyimide substrate sheet and a fusible polyimide film united to the substrate sheet, in which the fusible polyimide film shows a fusion endothermic peak in a differential scanning calorimeter and comprises aromatic polyimide having a recurring unit of the following formula (1):

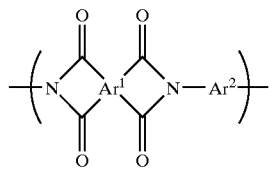

(1)

in which $Ar^1$ is a mixture of residues of tetracarboxylic dianhydrides comprising 12–25 mol. % of a residue of pyromellitic dianhydride, 5–15 mol. % of a residue of 3,3'4,4'-benzophenonetetracarboxylic dianhydride, and a remaining mol. % of a residue of 3,3',4,4'-biphenyltetracarboxylic dianhydride, and $Ar^2$ is an aromatic diamine residue comprising 1,3-bis(4-aminophenoxy) benzene.

6. The composite polyimide film of claim 5, in which the fusible polyimide film shows a fusion endothermic peak at a temperature in the range of 340–380° C. in a differential scanning calorimeter.

7. The composite polyimide film of claim 5, in which the polyimide substrate sheet comprises a polyimide prepared from 3,3',4,4'-biphenyltetracarboxylic dianhydride and one aromatic diamine selected from the group consisting of p-phenylenediamine and 4,4'-diaminodiphenyl ether or a polyimide prepared from at least one aromatic carboxylic dianhydride selected from the group consisting of 3,3',4,4'-biphenyltetracarboxylic dianhydride and pyromellitic dianhydride and a mixture of p-phenylenediamine and 4,4'-diaminodiphenyl ether.

8. The composite polyimide film of claim 5 which is prepared by the steps of co-extruding a solution of a polyamide acid for the preparation of the polyimide substrate sheet and a solution of a polyamide acid for the preparation of the polyimide having the recurring unit of the formula (1), to form a multi-layered polyamide acid solution, and beating the multi-layered polyamide acid solution until the multi-layered polyamide acid solution is dried and turns to the composite polyimide film.

9. The composite polyimide film of claim 5 which is prepared by the steps of coating on the polyimide substrate sheet a solution of a polyamide acid for the preparation of the polyimide having the recurring unit of the formula (1), and heating the coated polyamide acid solution until the coated acid solution is dried and turns to the polyimide film.

10. A metal/composite polyimide film laminate comprising the composite polyimide film of claim 5 and a metal film combined with the composite polyimide film via the fusible polyimide film.

11. The metal/composite polyimide film laminate of claim 10, which is prepared by pressing the metal film onto the composite polyimide film under heating.

12. The metal/composite polyimide film laminate of claim 10, in which the metal film has a thickness of 3 to 35 μm.

13. A metal/composite polyimide film/metal laminate comprising a first metal film having a thickness of 3 to 35 μm, a composite polyimide film having a thickness of 7 to 150 μm, and a second metal film having a thickness of 3 to 200 μm, in which the composite polyimide film comprises a polyimide substrate sheet and a fusible polyimide film united to each surface of the substrate sheet, in which the fusible polyimide film shows a fusion endothermic peak in a differential scanning calorimeter and has a recurring unit of the following formula (1):

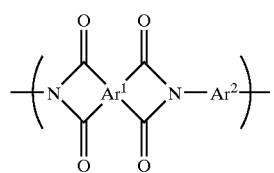

in which Ar¹ is a mixture of residues of tetracarboxylic dianhydrides comprising 12–25 mol. % of a residue of pyromellitic dianhydride, 5–15 mol. % of a residue of 3,3'4,4'-benzophenonetetracarboxylic dianhydride, and a remaining mol. % of a residue of 3,3',4,4'-biphenyltetracarboxylic dianhydride, and Ar² is an aromatic diamine residue comprising 1,3-bis(4-aminophenoxy) benzene.

14. The metal/composite polyimide film/metal laminate of claim 13, in which the fusible polyimide film of the composite shows a fusion endothermic peak at a temperature in the range of 340–380° C. in a differential scanning calorimeter.

15. The metal/composite polyimide film/metal laminate of claim 13, in which the composite polyimide film shows a modulus in tension in the range of 400 to 1,000 kgf/mm² in each of machine direction and traverse direction.

16. The metal/composite polyimide film/metal laminate of claim 13, in which each of the metal film is fixed to the composite polyimide film at a 90° peel strength of 0.8 kgf/cm or higher at 25° C.

17. The metal/composite polyimide film/metal laminate of claim 13, in which the first metal film is a stainless steel film and the second metal film is a copper film or a stainless steel film.

18. A metal film/composite polyimide film/metal film laminate in which each metal film independently is a copper film or a stainless steal film, comprising a first metal film having a thickness of 3 to 35 μm, a composite polyimide film having a thickness of 7 to 150 μm, and a second metal film having a thickness of 3 to 200 μm, in which the composite polyimide film comprises a polyimide substrate sheet and a fusible polyimide film united to each surface of the substrate sheet, in which the fusible polyimide film shows a fusion endothermic peak in a differential scanning calorimeter, the composite polyimide film shows a modulus in tension in the range of 400 to 1,000 kgf/mm² at 25° C. in machine direction and traverse direction, the composite polyimide film shows a chemical etchable rate of 2.0 μm/min. or more, and both of the metal films are bonded to the composite polyimide film at 90° peel strength of 0.8 kgf/cm or more.

19. The fusible polyimide of claim 1, wherein the mixture of residues of tetracarboxylic dianhydrides comprises the residue of 3,3',4,4'-biphenyltetracarboxylic dianhydride in an amount of 60 to 80 mol. %.

20. The fusible polyimide of claim 3, wherein the mixture of residues of tetracarboxylic dianhydrides comprises the residue of 3,3',4,4'-biphenyltetracarboxylic dianhydride in an amount of 60 to 80 mol. %.

21. The composite polyimide of claim 5, wherein the mixture of residues of tetracarboxylic dianhydrides comprises the residue of 3,3',4,4'-biphenyltetracarboxylic dianhydride in an amount of 60 to 80 mol. %.

22. The metal/composite polyimide film/metal laminate of claim 13, wherein the mixture of residues of tetracarboxylic dianhydrides comprises the residue of 3,3',4,4'-biphenyltetracarboxylic dianhydride in an amount of 60 to 80 mol. %.

* * * * *